US009779985B2

(12) United States Patent
Belledent et al.

(10) Patent No.: US 9,779,985 B2
(45) Date of Patent: Oct. 3, 2017

(54) METHOD FOR MAKING PATTERNS BY SELF-ASSEMBLY OF BLOCK COPOLYMERS

(71) Applicant: COMMISSARIAT A L'ENERGIE ATOMIQUE ET AUX ENERGIES ALTERNATIVES, Paris (FR)

(72) Inventors: Jérôme Belledent, Meylan (FR); Patricia Pimenta Barros, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/313,792

(22) PCT Filed: May 21, 2015

(86) PCT No.: PCT/FR2015/051345
§ 371 (c)(1),
(2) Date: Nov. 23, 2016

(87) PCT Pub. No.: WO2015/181474
PCT Pub. Date: Dec. 3, 2015

(65) Prior Publication Data
US 2017/0154810 A1    Jun. 1, 2017

(30) Foreign Application Priority Data
May 26, 2014   (FR) .................................. 14 54712

(51) Int. Cl.
*H01L 21/4763* (2006.01)
*H01L 21/768* (2006.01)
*H01L 21/027* (2006.01)

(52) U.S. Cl.
CPC .... *H01L 21/76816* (2013.01); *H01L 21/0271* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 8,114,301 B2 * | 2/2012 | Millward ............ | B81C 1/00031 216/17 |
| 9,086,621 B2 * | 7/2015 | Wuister ................ | G03F 7/0002 |

(Continued)

OTHER PUBLICATIONS

International Search Report and Written Opinion of the International Searching Authority as issued in International Patent Application No. PCT/FR2015/051345, dated Aug. 13, 2015.

(Continued)

*Primary Examiner* — Bradley K Smith
(74) *Attorney, Agent, or Firm* — Pillsbury Winthrop Shaw Pittman LLP

(57) ABSTRACT

A method for making patterns includes forming on a substrate surface a first mask delimiting at least two areas to be metallised; forming an assembly guide above the first mask, the assembly guide delimiting a surface covering two contact areas belonging respectively to the two areas to be metallised; depositing on the surface a block copolymer layer; reorganising the block copolymer layer; eliminating one of the phases of the reorganised block copolymer layer, resulting in a plurality of holes extending into the block copolymer layer above the two contact areas and a portion of the first mask arranged between the two contact areas; widening the holes of the block copolymer layer until a continuous trench is formed above the two contact areas and the portion of the first mask; transferring, through the first mask, the continuous trench onto the surface of the substrate to form patterns corresponding to the contact areas.

11 Claims, 7 Drawing Sheets

F7

F8

(56) References Cited

U.S. PATENT DOCUMENTS

2009/0200646 A1     8/2009  Millward et al.
2014/0091476 A1     4/2014  Nyhus et al.
2016/0247686 A1*    8/2016  Latypov .............. H01L 21/3086

OTHER PUBLICATIONS

Search Report and Written Opinion as issued in French Patent Application No. 1454712, dated Feb. 5, 2015.
Oria, L., et al., "Guided self-assembly of block-copolymer for CMOS technology: a comparative study between grapho-epitaxy and surface chemical modification," SPIE, 2011, vol. 7970-24, 10 pages.
Yi, H., et al., "Contact Hole Patterning for Random Logic Circuits using Block Copolymer Directed Self-Assembly," Alternative Lithography Technologies IV, Proc. of SPIE, vol. 8323, 2012, 6 pages.
International Preliminary Report on Patentability and Written Opinion of the International Searching Authority as issued in International Patent Application No. PCT/FR2015/051345, dated Nov. 29, 2016.

* cited by examiner

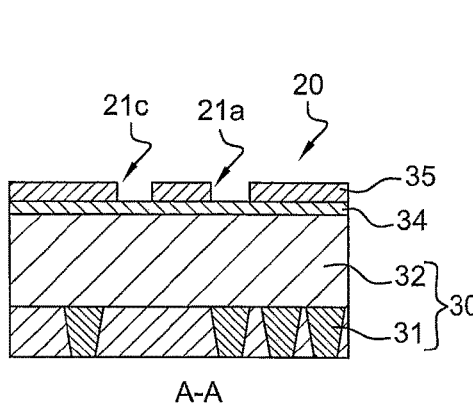
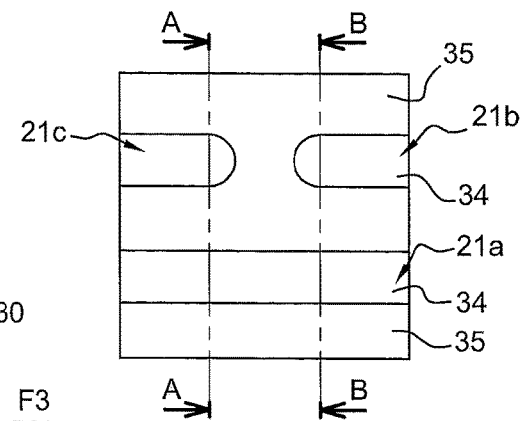
Fig. 3C    Fig. 4C
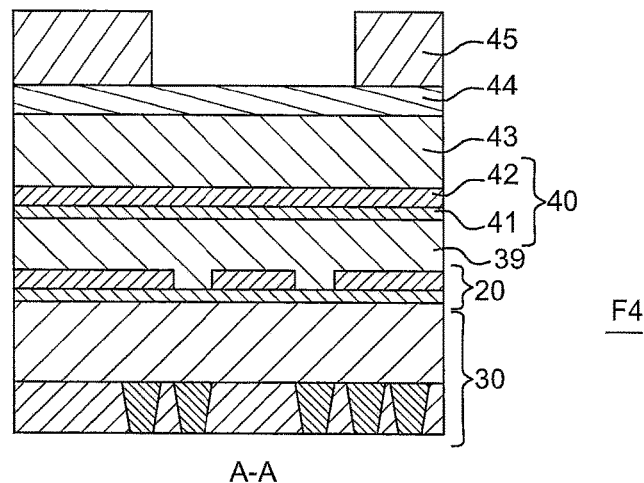
Fig. 3D
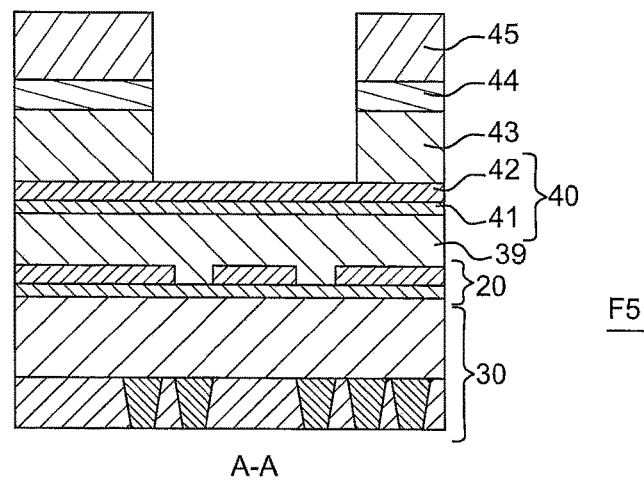
Fig. 3E

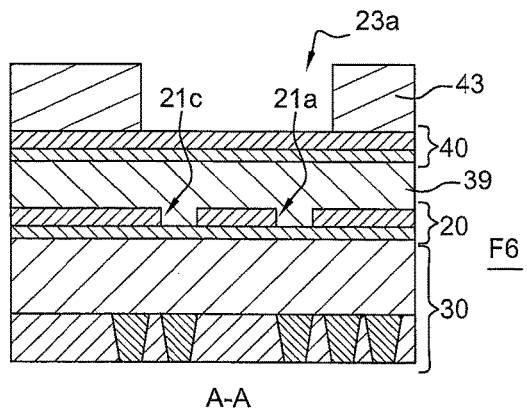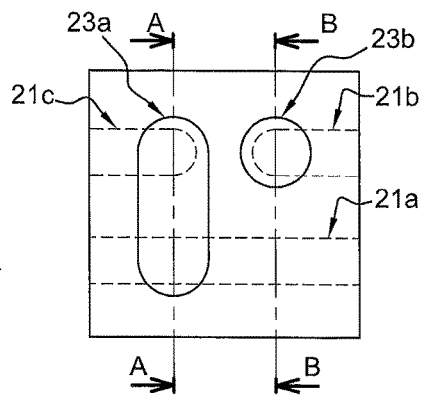
Fig. 3F  Fig. 4F
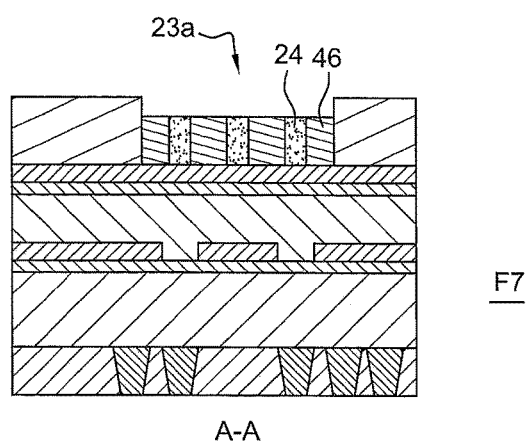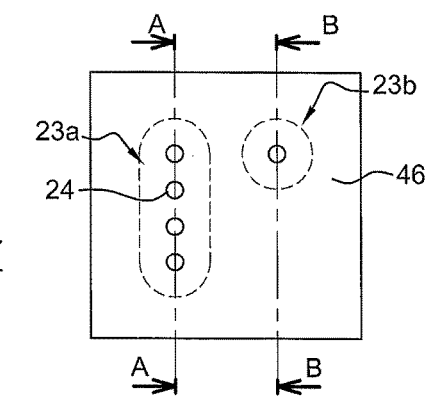
Fig. 3G  Fig. 4G
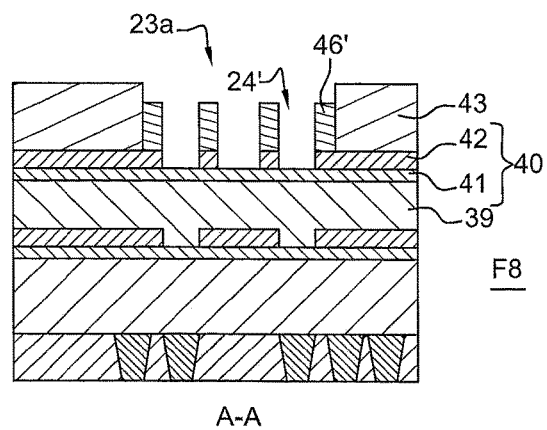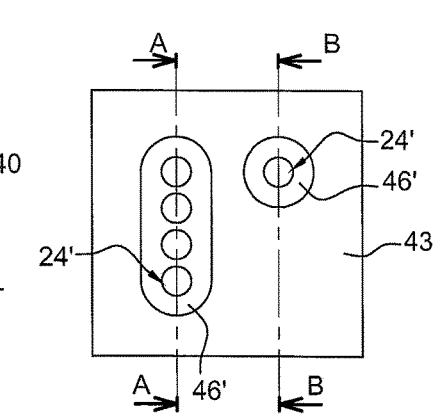
Fig. 3H  Fig. 4H

METHOD FOR MAKING PATTERNS BY SELF-ASSEMBLY OF BLOCK COPOLYMERS

CROSS REFERENCE TO RELATED APPLICATIONS

This application is the U.S. Stage of PCT/FR2015/051345, filed May 21, 2015, which in turn claims priority to French Patent Application No. 1454712 filed May 26, 2014, the entire contents of all applications are incorporated herein by reference in their entireties.

Technical Field

The present invention relates to techniques of directed self-assembly (DSA) of block copolymers in order to generate patterns of very high resolution and density. The invention more particularly relates to a method for making patterns on the surface of a substrate, such as a contact hole or a trench, using block copolymers.

State Of The Art

The needs of methods for making patterns of nanometric dimensions have increased sharply over recent years, due to the trend of miniaturisation of electronic components.

Initially, the patterns were made by optical projection lithography. In this production method, a photosensitive layer is deposited on a substrate, then exposed to an ultraviolet beam through a mask defining the patterns. The size of the smallest pattern that can be made (also called critical dimension "CD") is closely linked to the wavelength of the beam used: the shorter the wavelength, the finer the pattern made and the greater the integration density of these patterns in an integrated circuit.

The ultraviolet beams used in photolithography traditionally have a wavelength of 193 nm or 248 nm. This method for defining patterns has the advantage of being well controlled and less expensive than other methods, particularly electronic lithography methods. Nevertheless, with such wavelengths, the resolution of the exposure tool is limited.

In order to make finer, better resolved patterns, and thus to further increase the integration density, new methods have been developed, such as double-patterning photolithography, extreme ultraviolet lithography (EUV) and electron beam (e-beam) lithography.

Among emerging lithography technologies, it is also possible to cite techniques of directed self-assembly (DSA) of block copolymers. Block copolymers are polymers in which two repeating units, a monomer A and a monomer B, form chains bound together by a covalent bond. When sufficient mobility is given to the chains, for example by heating said block copolymers, the chain A and the chain B have a tendency to separate into phases or blocks and to reorganise themselves into specific conformations, which depend especially on the ratio between the monomer A and the monomer B. As a function of this ratio, it is possible for example to have spheres of monomer A in a matrix of monomer B, or instead cylinders of A in a matrix of B, or instead intercalated lamellas of A and lamellas of B. Block copolymers thus have the property of forming patterns which can be controlled using the ratio of monomers. Then, by selectively removing one of the two phases of the copolymer (for example the cylinders of A), these patterns of monomer may be transformed into cavities.

Known techniques of self-assembly of block copolymers can be grouped together into two categories, grapho-epitaxy and chemi-epitaxy, both described in detail in the article ["Guided self-assembly of block-copolymer for CMOS technology: a comparative study between grapho-epitaxy and surface chemical modification", L. Oria et al., SPIE 2011, Vol. 7970-24].

Grapho-epitaxy consists in forming primary patterns called guides on the surface of a substrate, said guides delimiting areas inside which a block copolymer layer is deposited. The guides make it possible to control the organisation of the blocks of copolymer to form secondary patterns of higher resolution inside these areas. Alternatively, chemi-epitaxy consists in modifying the chemical properties of certain portions of the substrate, to force the organisation of the blocks of copolymer between these portions. Like the guides formed by grapho-epitaxy, these chemically modified portions of the substrate are delimited by a conventional photolithography step.

Given their high resolution, DSA techniques have recently been used to form the holes of contacts of an integrated circuit. These contacts, also called vias, allow to electrically connect two superimposed interconnection levels in an integrated circuit. Yet, with the miniaturisation of components, the vias are increasingly numerous and close together.

Document US2014/091476 discloses a method of self-assembly of block copolymer to form contact holes in a dielectric layer containing lower interconnection lines. These contact holes are "self-aligned" with the upper interconnection lines, thanks to the fact that the hard mask serving to delimit the upper interconnection lines also constitutes the assembly guide of the block copolymer. The contact holes are obtained by assembling the block copolymer deposited in the mask, then by etching certain of the blocks of copolymer through a mask made of photosensitive resin.

Similarly, in the article entitled "Contact Hole Patterning for Random Logic Circuits using Block Copolymer Directed Self-Assembly" (Alternative Lithography Technologies IV, Proc. of SPIE, Vol. 8323, 2012), a grapho-epitaxy method is used to print the vias. A photolithography is applied to define the assembly guides of a block copolymer. The guides are elaborated such that the cavities formed by means of the block copolymer correspond to the layout of the vias.

FIG. 1A represents an example of several contacts 10 to be formed and the corresponding assembly guide 11. It may be noted that in this example the cavities 12 resulting from the assembly of copolymer correspond relatively well with the layout of the contacts 10 to be formed. On the other hand, in FIG. 1B obtained using the same method, but with a slight shift of parameters (linked to the natural variations of the method), in this instance a defocus of 60 nm, cavities 12 which are obtained no longer correspond to the expected contacts 10. This is due to the fact that the guide 11 is not sufficiently defined, because the resolution of the photolithography tool having formed the guide is not sufficient.

To avoid this problem, the aforementioned article proposes using simplified guide shapes, of rectilinear trench type, with at the maximum three cavities 12 per guide. It follows that to print all of the vias by grapho-epitaxy between two metal levels of an integrated circuit, several steps of printing with self-assembly are necessary. For example, in FIG. 1C, the guides 11A, 11B and 11C will be formed during a first pass (because they are sufficiently far apart from each other so as not to be merged during the photolithography step), and the remaining guide 11D is formed during a second pass (in other words, by an additional level).

In addition to the fact that such a method is long and costly, problems of alignment exist between the patterns resulting from the different exposures. Several statistical populations of contacts are in fact obtained.

SUMMARY OF THE INVENTION

It is observed that there exists a need to provide a method for making patterns on the surface of a substrate by self-assembly of block copolymers, and particularly cylindrical block copolymers, which allows to expose a level of contacts in fewer exposure steps, and advantageously in a single step, while maintaining great freedom in the positioning of these contacts.

According to the invention, this need tends to be satisfied by providing for the following steps:

forming on the surface of the substrate a first mask delimiting at least two areas to be metallised;

forming an assembly guide above the first mask, such that the assembly guide delimits a surface covering two contact areas belonging respectively to the two areas to be metallised;

depositing on said surface a block copolymer layer;

reorganising the block copolymer layer;

eliminating one of the phases of the reorganised block copolymer layer, resulting in a plurality of holes extending into the block copolymer layer above two contact areas and a portion of the first mask arranged between the two contact areas;

widening by etching the holes of the block copolymer layer, until a continuous trench is formed above the two contact areas and said portion of the first mask;

transferring, through the first mask, the continuous trench onto the surface of the substrate so as to form patterns corresponding to the contact areas.

In a preferential embodiment, the method further comprises the following steps:

depositing a planarization layer on the first mask and at least one layer intended to form a second mask on the planarization layer, the assembly guide and the block copolymer layer being formed on said layer intended to form the second mask;

forming simultaneously the continuous trench in the block copolymer layer and in the second mask; and transferring the continuous trench of the second mask into the planarization layer up to the first mask.

Preferably, the second mask is formed of a stack comprising a nitride layer and an oxide layer.

According to a development, the formation of the trench in the second mask comprises successively a step of anisotropic etching of the nitride layer through the block copolymer layer, a step of isotropic etching of the nitride layer, a step of anisotropic etching of the oxide layer through the nitride layer and a step of isotropic etching of the oxide layer.

The widening of the holes of the block copolymer layer takes place advantageously during steps of isotropic etching of the nitride layer and of the oxide layer.

The method according to the invention may also have one or more of the following characteristics, considered individually or according to all technically possible combinations thereof:

the assembly guide is rectilinear and arranged such that the two contact areas occupy the ends of the surface delimited by the assembly guide;

the assembly guide is formed by grapho-epitaxy and the method comprises a step of depositing a grafting layer on the lateral walls and at the bottom of the assembly guide;

the block copolymer contains polystyrene and polymethyl methacrylate and the grafting layer is based on homo-polystyrene;

the method comprises a step of etching the grafting layer by a plasma containing oxygen, immediately after the elimination of one of the phases of the reorganised block copolymer layer;

the substrate comprises an electrical connection level and a dielectric material layer covering the electrical connection level and in which are formed said patterns; and the patterns on the surface of the substrate are interconnection holes traversing the dielectric material layer up to the electrical connection level.

BRIEF DESCRIPTION OF THE FIGURES

Other characteristics and advantages of the invention will become clear from the description that is given thereof below, by way of indication and in no way limiting, with reference to the appended figures, among which:

FIGS. 3A to 3K represent, in sectional view along the axis A-A of FIG. 2, the steps of a method for making patterns according to a preferential embodiment of the invention;

FIGS. 4C, 4F, 4G, 4H, 4I, 4J and 4K are top views of the substrate during the steps of FIGS. 3C, 3F, 3G, 3H, 3I, 3J and 3K.

For greater clarity, identical or similar elements are marked by identical reference signs in all of the figures.

DETAILED DESCRIPTION OF AT LEAST ONE EMBODIMENT

A method of directed self-assembly (DSA) of block polymers is described hereafter. This method allows to print, in a single step, a high density of patterns on the surface of a substrate. This method is advantageously used to form the contact holes of an integrated circuit from cylindrical block copolymers.

The method applies more particularly to contacts that are separated from each other by a distance less than the minimum resolution pitch by photolithography. For example, with an immersion photolithography tool of wavelength equal to 193 nm, the minimum pitch between two patterns is around 88 nm. Consequently, all the contacts having a neighbour spaced less than 88 nm away are going to be grouped together in order to be printed in the same guide.

This method can also apply to contact holes not having an immediate neighbour, but the dimensions of which are such that they cannot be resolved by photolithography or instead in order to improve the dimensional control of these holes.

Figure 1A:
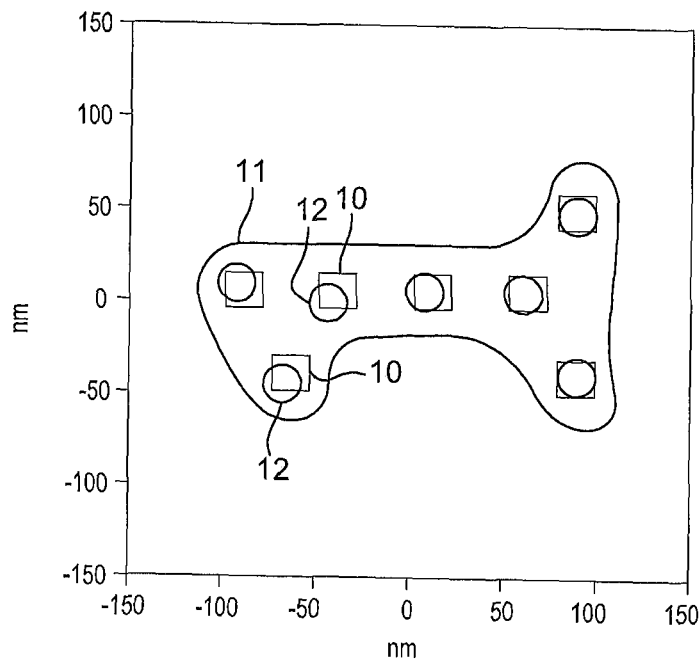
FIGS. 1A, 1B and 1C represent contact holes formed by a method of self-assembly of block copolymers according to the prior art, using one or more assembly levels of block copolymer.
Figure 1B:
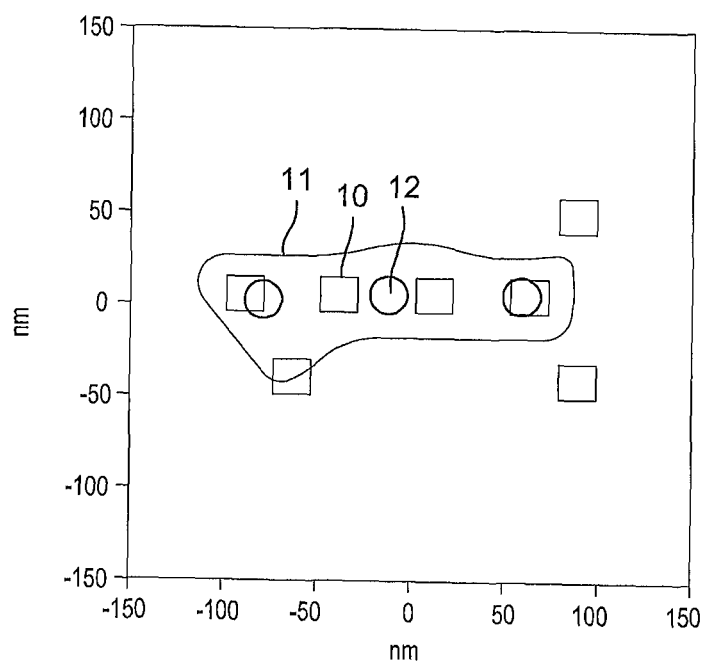
Figure 1C:
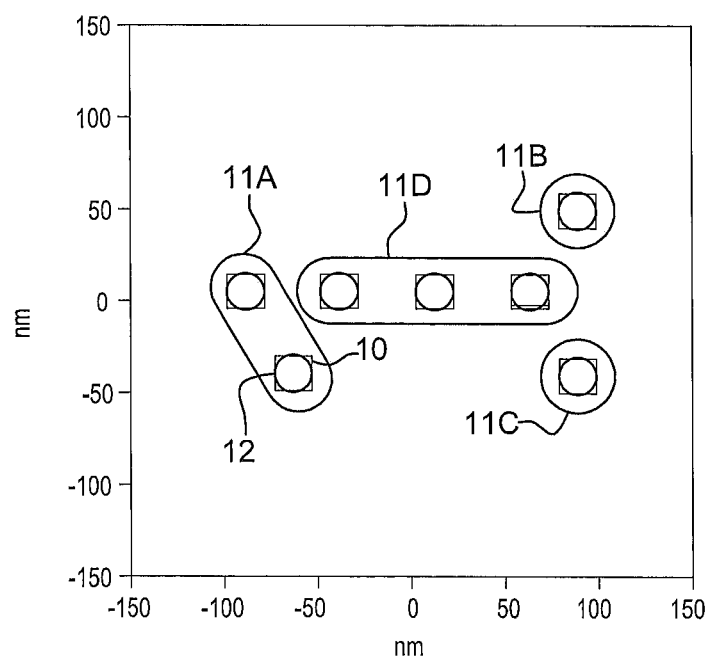
Figure 2:
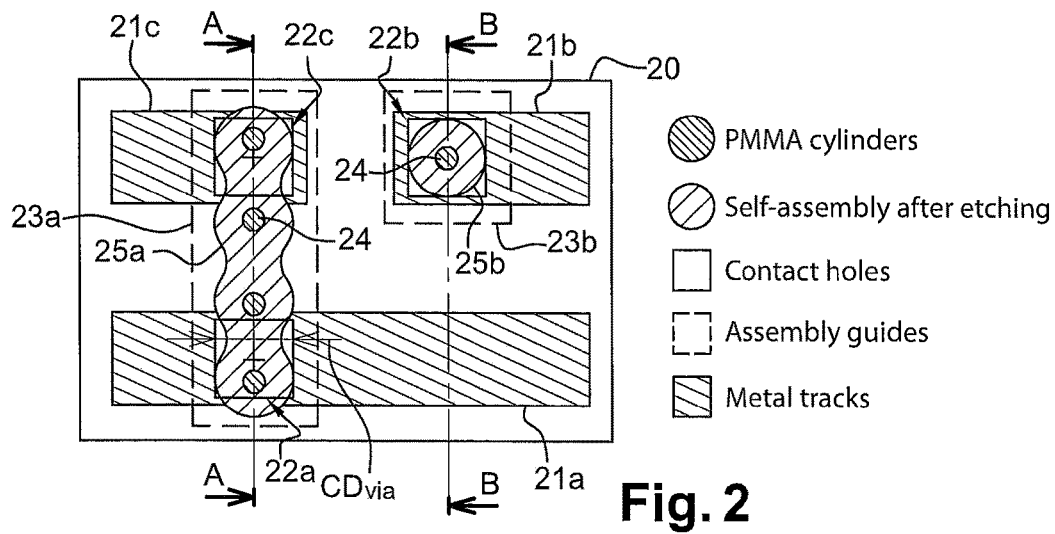
FIG. 2 is a principle drawing of a method for making patterns by self-assembly of block copolymers according to the invention.

FIG. 2 is a principle drawing of the method explaining, in one or the other of these situations, in what way it is possible to form contact holes in good number and at the right emplacements in a substrate. In this example represented in top view, it is aimed to form an interconnection level comprising three metal tracks, and three vertical contacts or "vias" which connect the metal tracks to a lower metal level (not represented), that is to say situated below the metal tracks.

In this method, the metal tracks and the vias are delimited using a mask 20. The mask 20 comprises recesses 21a to 21c corresponding to the future metal tracks. In other words, the mask delimits areas 21a-c of the substrate to be metallised to form the tracks. Inside the areas to be metallised 21a-c appear contact areas 22a to 22c, represented by solid line squares. They define the emplacement of the contact holes, to form the vias.

The two contact areas 22a and 22c, situated on the left in FIG. 2 and belonging respectively to the areas to be metallised 21a and 21c, are too close together to be able to be printed in a traditional manner by photolithography. The third contact area 22b, situated on the right and belonging to the area to be metallised 21b, corresponds to the case of an isolated contact of which it is desired to control precisely the dimensioning. Thus, to define these contact areas 22a to 22c, a block copolymer is going to be used.

Assembly guides of the block copolymer are firstly formed on the mask 20, preferably by grapho-epitaxy. The contact areas 22a and 22c are grouped together within a same assembly guide 23a. The guide 23a thus delimits a surface covering the contact areas 22a and 22c, but also a portion of the mask 20 arranged between these two areas. The contact area 22b has its own guide 23b.

The guides 23a and 23b may be formed by photolithography (at 193 nm for example), given that they have dimensions greater than the critical dimension (i.e. dimension of the small pattern) that can be attained by photolithography.

Then, a layer of block copolymer, for example polystyrene-b-polymethyl methacrylate (PS-b-PMMA), is deposited in the guides 23a and 23b. The blocks of polystyrene and the blocks of PMMA are then reorganised. In the example of FIG. 2, this produces four cylinders 24 of PMMA in the guide 23a and a single cylinder 24 of PMMA in the guide 23b, the cylinder(s) in each guide being surrounded by a polystyrene matrix.

In the rectilinear guide 23a, the cylinders 24 of PMMA are distributed along a line A-A situated at the centre of the guide and oriented in the direction of the length of the guide. In the square shaped guide 23b, the single cylinder 24 of PMMA occupies the central area of the square.

The method then comprises a step of eliminating one of the phases of the reorganised block copolymer layer, the PMMA phase in the preceding example. The cylinders 24 of PMMA are thus etched to form a plurality of holes in the guide 23a (4 holes in the example of FIG. 2) and a single hole in the guide 23b.

As may be seen in FIG. 2, the cylindrical holes 24 formed by etching of the PMMA have dimensions much smaller than the contact areas 22a-c, that is to say than the vias that it is desired to form. This is not problematic, in so far as they are then widened by etching of the polystyrene matrix. Indeed, the critical dimension obtained thanks to the use of the block copolymer is certainly much less than that which can be attained by photolithography at 193 nm ($CD_{DSA} \approx 15$-$20$ nm and $CD_{photo} \approx 55$ nm), but also less than that desired for the vias (typically $CD_{via} \approx 48$ nm). In other words, the block copolymer is so resolving that it is necessary to widen the holes formed by the etching of the PMMA to reach the desired critical dimension.

In the guide 23a, the holes 24 are widened by etching the block of polystyrene, until the holes merge into a continuous trench 25a that covers the contact areas 22a, 22c in quasi-totality and the portion of the mask 20 arranged between the contact areas 22a and 22c. In the same way, the hole 24 of the guide 23b occupies, after etching of the polystyrene (widened hole 25b), substantially the same surface area as that provided by the layout of the via (contact area 22b).

Finally, during a final step of the method, the trench 25a is transferred into the substrate on which lays the mask 20, and more particularly into a dielectric layer intended to separate the two consecutive interconnection levels. Here, only the parts of the trench 25a covering the areas to be metallised 21a and 21c are transferred into the dielectric layer, because outside of these areas, the mask 20 blocks the etching of the dielectric layer. More particularly, under the portion of the mask 20 arranged between the two contact areas 22a and 22c, the underlying dielectric layer is not etched, such that two separate contact holes are obtained in the dielectric layer. The contact holes thereby formed are at the emplacements and dimensions provided by the layout of the contact areas 22a and 22c. These contact holes could then be filled with metal to form the vias and connect the two interconnection levels.

The contact holes on the surface of the substrate thus result from the superposition of the mask 20 defining the metal tracks and from the assembly of copolymer delimiting the trench 25a. The contact areas 22a and 22c may be very close to each other, as long as a portion of mask 20 separates them. The pitch of the patterns to be printed is consequently controlled by the mask 20 of the metal tracks.

Thanks to this method, the cylinders 24 of PMMA situated at the ends of the guide 23a do not need to be perfectly centred with respect to the contact areas 22a and 22c, in one direction at least. To be specific, they may be slightly offset with respect to the median line of the contact areas 21a and 21c (cf. FIG. 2), in so far as the widening and the merging of the cylindrical holes is going to compensate this offset. This allows to relax partially (in one direction only) the constraints on the placement of the assembly guides, and particularly to form assembly guides compatible with the resolution of the photolithography equipment. On the other hand, in the perpendicular direction (in the axis of the rectilinear guide 23a), the cylinders 24 are advantageously aligned with the straight line A-A connecting the centres of the contact areas 22a and 22b. This control is however easy to achieve, by virtue of the rectilinear shape of the guide and the considerable lateral spacing between two consecutive guides (greater than the minimum resolution pitch by photolithography).

Besides, the fact of being able to have fewer exposures compared to the prior art, or even a single exposure, makes it possible to reduce the number of statistical populations of vias, thereby enabling better control of the alignment.

It will also be noted that the position of the central cylinders, i.e. above the mask 20, has little importance in this method. The corresponding portion of the trench 25a may have any shape, since it will not be transferred into the dielectric.

Conversely, the position of the cylinders of PMMA above the contact areas 22a and 22c is more delicate, as has been described above. The assembly guide 23a is, preferably, arranged so that the contact areas 22a and 22c occupy the ends of the guide. Thus, the cylinders 24 of PMMA at the ends of the guide coincide substantially with the contact areas 22a and 22c (the cylinders at the ends are in general less subject to variations in positioning than the cylinders at the centre of the guide).

Similarly, the widened hole 25b of the guide 23b is transferred into the dielectric layer through the area to be metallised 21b of the mask 20, thereby forming a perfectly positioned contact hole and with the correct dimensions with respect to the contact area 22b.

The use of a block copolymer allows to obtain a critical dimension $CD_{via}$ smaller than that which can be attained by conventional photolithography techniques. Moreover, in the hypothesis where two adjacent assembly guides would merge during the photolithography step, the position of the cylinders inside the merged guides would be practically unchanged with respect to that where the guides are separate. There would thus not be any undesirable cylinder of PMMA in the junction area of the two guides.

The fact of forming cylinders of PMMA between two guides may be problematic, if at the same place it is also provided to form a metal track. In fact, in this case, the cylinder overhangs a recess of the mask 20 and will be transferred into the dielectric layer, forming a contact hole up to the lower interconnection layer (rather than a simple trench to receive said metal track). Consequently, the use of block copolymer also allows to relax the constraints on the placement of the guides, while avoiding forming an undesirable contact hole (the guides may be, in one direction, close to each other).

Two assembly guides are likely to merge (for example the rectilinear guide 23a of FIG. 2 and another rectilinear guide of same orientation situated in the extension of the guide 23a), because their dimensions can vary (particularly due to variations of the parameters of the photolithography method: exposure dose, dimensions of the masks, focusing distance, etc.). Block copolymers thus have the particularity of compensating the dimensional variations of the guides.

As an example, for a guide of "target" (i.e. desired) critical dimension comprised between 45 nm and 55 nm, the maximum error made on this dimension (due to the variabilities of the photolithography method) is about 10 nm, whereas the maximum error on the critical dimension of the cylinders of PMMA formed in these guides is only 2 nm. The dimensional control of the patterns is thus improved thanks to the use of block copolymers (here by a factor of 5).

The assembly guides 23a and 23b have, preferably, a critical dimension comprised between 45 nm and 55 nm, because in this range, the filling rate of the cylinders in the guides is maximal (in other words, the cylinders of PMMA are all formed).

As indicated previously, two neighbouring contacts separated by a portion of the mask 20 are grouped together within a same guide and printed together by means of this DSA method. From the point of view of the layout of the contacts, this meant grouping together two contacts when the segment connecting the centres of these contacts exactly crosses two edges of metal tracks (for example in FIG. 2, the segment connecting the centres of the areas 22a and 22c intercepts the upper edge of the area/track 21a and the lower edge of the area/track 21c).

Alternatively, two contacts may be grouped together even if they belong to the same area to be metallised (and that they are thus not separated by a portion of mask 20), providing that the future contact holes emerge on the same line of metal of the lower interconnection level. Otherwise, a short-circuit of the two lines of metal of the lower level would be caused, because the entire trench connecting the two contacts is in this case transferred through the mask 20.

A preferential embodiment of the method for making patterns according to the invention will now be described in detail, in relation with FIGS. 3A to 3K. These figures represent in sectional view along A-A (FIG. 2) steps F1 to F11 to form contact holes between two interconnection levels in an integrated circuit. FIGS. 4C, 4F to 4K are top views of the substrate taken respectively during the steps of FIGS. 3C, 3F to 3K.

Steps F1 to F3 (FIGS. 3A-3C and 4C) enable the formation of the mask 20 on the surface of a substrate 30. The substrate 30 comprises a first electrical interconnection level 31 covered with a dielectric layer 32, for example made of silicon oxide.

Figure 3A:
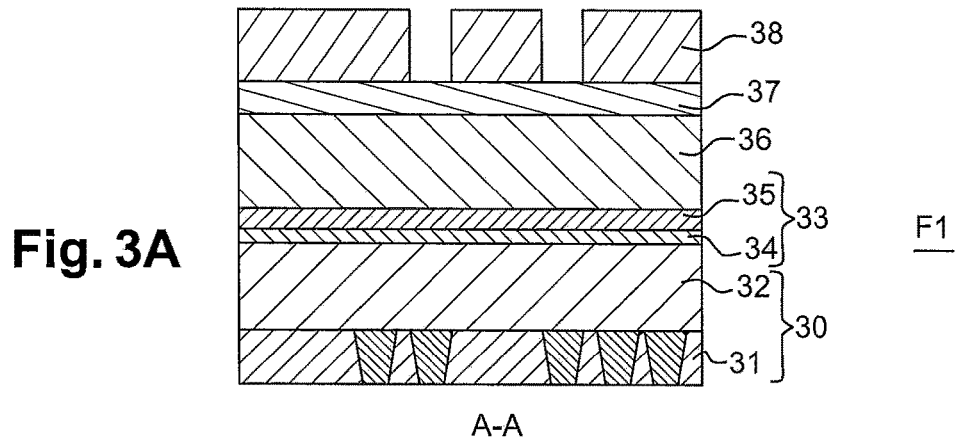
Figure 3B:
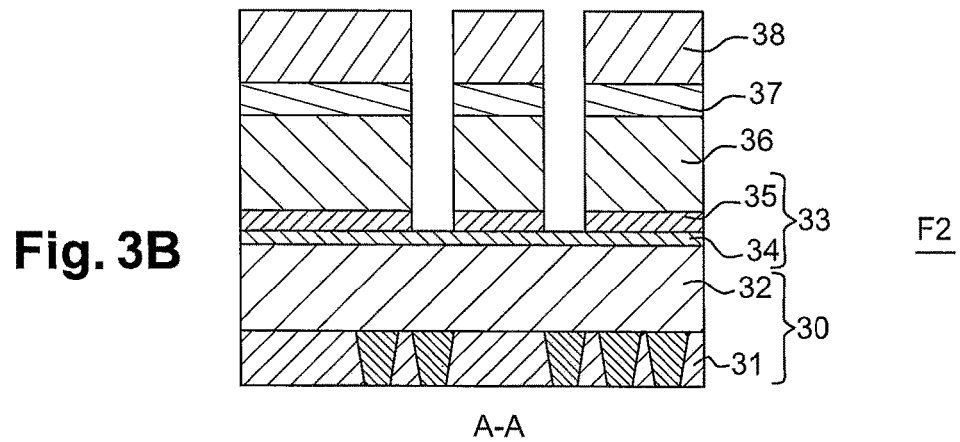

At step F1 of FIG. 3A, a two-layer stack 33 intended to form the mask 20 is deposited on the surface of the substrate 30. The stack 33 comprises advantageously an oxide layer 34 (for example silicon oxide of 40 nm thickness), in contact with the dielectric layer 32, and a nitride layer 35, for example made of titanium nitride TiN of 15 nm thickness, arranged on the oxide layer 34. Then, the stack 33 is covered with a planarization layer made from an organic material (OPL, for "Organic Planarization Layer") and an anti-reflective coating (ARC) 37.

A resin layer 38 is then deposited on the anti-reflective coating layer 37, then structured, preferably by double patterning photolithography. The layers 36 and 37 allow to absorb the light waves reflected by the substrate during exposure steps, avoiding the creation of stationary waves and thereby improving the dimensional control. The patterns formed in the resin correspond to the layout of the areas to be metallised 21a to 21c, to form the upper interconnection level.

In F2 (FIG. 3B), the resin patterns are transferred into the anti-reflective coating layer 37, the planarization layer 36 and the nitride layer 35. This transfer may be achieved by successive etching steps, of plasma type. The ARC layer 37 is selectively etched through the resin 38, then plays the role of hard mask for the etching of the OPL layer 36, the latter serving in its turn as mask for etching the TiN layer 35. The oxide layer 34 serves advantageously as stop layer for the etching of the TiN.

After removal of the layers 36 to 38 at step F3 of FIGS. 3C and 4C, the mask 20 and its recesses 21a-21c are obtained (i.e. the areas to be metallised 21a-21c). They will serve to form the metal tracks.

At step F4 (FIG. 3D), the layers that will serve to form the assembly guides 23a and 23b of FIG. 2 are deposited on the substrate 30 covered with the mask 20. Another planarization layer 39, preferably made from organic material, is thus deposited on the first mask 20, then a second masking level 40 is formed on the planarization layer 39. Like the first mask 20, the second masking level 40 advantageously comprises an oxide layer 41 (for example a TEOS oxide) and a nitride layer 42 (for example TiN). Finally, the second masking level 40 is successively covered with an OPL layer 43, an ARC layer 44 and a resin layer 45.

In this preferential embodiment, the assembly guides are formed by optical photolithography and etching of the planarization layer 43 deposited on the second masking level 40. The resin 45 is exposed through a removable mask (not represented) then developed (FIG. 3D) and, in F5 (FIG. 3E), the ARC 44 and OPL 43 layers are etched in an anisotropic manner (for example by plasma) through the developed resin layer 45.

As previously, the thicknesses and the optical indices of the OPL 43 and ARC 44 layers are chosen to minimise the reflection of light at the exposure wavelength of the photolithography tool. The assembly guides then have better resolution.

At step F6 of FIGS. 3F (sectional view along A-A) and 4F (top view), the resin layer 45 is removed (stripping step) and the ARC layer 44 is eliminated, for example using a fluorinated etching. The fluorinated etching modifies the surface state of the guides 23a and 23b formed in the OPL layer 43, by forming on the surface of the guides fluorine groups which will prevent the layer of copolymer adhering thereto. To remedy this, a grafting layer may be deposited on the side walls and in the bottom of the guides 23a and 23b. It allows to neutralise the fluorine groups.

As described previously in relation with FIG. 2, the guide 23a is arranged such that it overhangs a part of the recesses 21a and 21b of the mask (FIGS. 3F, 4F). The guide 23b, visible only in the top view of FIG. 4F, overhangs a part of another recess of the mask 20, that corresponding to the area to be metallised 21b.

At step F7 (FIGS. 3G and 4G), a block copolymer layer 46 is deposited inside the guides 23a and 23b, on the surfaces covered with the grafting layer. The copolymer is, preferably, spread over the entire surface of the substrate by spin-coating. Then, the copolymer is assembled, for example by heating the copolymer layer 46.

The block copolymer is, preferably, a two-block copolymer containing polystyrene (PS) and polymethyl methacrylate (PMMA). Different proportions of PS and PMMA may be envisaged. As an example, with 30% by weight of PMMA and 70% by weight of PS, the blocks of PMMA are, after assembly, in the form of cylinders 24 contained in a matrix of PS.

In the case of a PS-b-PMM block copolymer, the grafting layer is, for example, based on homo-polystyrene. The homo-polystyrene guarantees, in the integration example proposed here, good affinity of the PS-b-PMMA block copolymer with the walls of the guides 23a and 23b.

Advantageously, a layer of random PS-r-PMMA copolymer may also be deposited on the bottom of the guides 23a and 23b. This layer further improves the affinity of the copolymer with the bottom of the guides, thereby enabling the cylinders 24 of PMMA to descend to the bottom of the guides.

At step F8 of FIGS. 3H and 4H, the cylinders of PMMA are etched selectively with respect to the matrix of polystyrene, for example by immersing the substrate in 99% concentrated acetic acid for 10 minutes. A plurality of cylindrical holes 24' are then obtained in a residual layer 46' composed uniquely of polystyrene.

In this preferential embodiment, the widening and the merging of the cylindrical holes 24' are obtained thanks to several successive etching steps, preferably of RIE plasma type.

Firstly, if a grafting layer made of homo-polystyrene has been deposited at the bottom of the assembly guides, this is etched by RIE, preferably using a plasma containing oxygen ($O_2$). Gaseous mixtures based on $O_2$ such as $HBr/O_2$, $Cl_2/O_2$, $CO/O_2$, $SO_2/O_2$, $N_2/O_2$, $He/O_2$ and $C_xH_y/O_2$ may be used. As an example, the plasma is generated from a mixture of $Ar/O_2$ gas, under a pressure of 10 mTorr, with a power of 220 W and a polarisation voltage of 200 V. The etching speed of this plasma is around 779 Å/min.

By etching the neutralisation layer in this way, the cylindrical holes 24' of the polystyrene layer 46' are widened slightly. Preferably, the quantity of oxygen in the gas mixture is comprised between 9% and 100% of the mixture, and the etching time is comprised between 5 s and 30 s. In these conditions, only a part of the polystyrene of the layer 46' is etched (the thickness of the layer 46' of PS is, after etching, greater than or equal to 10 nm). It is thus still possible to distinguish the holes 24' of the layer 46'.

The holes 24' are then transferred into the titanium nitride layer 42 of the second masking level 40, as is represented in FIGS. 3H and 4H. This transfer is, preferably, carried out using an anisotropic plasma etching (of RIE type for example) through the polystyrene layer 46', with a stop on the oxide layer 41 of the second masking level 40. When the layer 42 is made of TiN, the plasma is preferably generated using a gaseous mixture containing chlorine ($Cl_2$): $Cl_2/Ar$, $Cl_2/He$, $Cl_2/C_xH_y$, $Cl_2/Ar/C_xH_y$, $Cl_2/C_xF_y$, $Cl_2/Ar/C_xF_y$, $Cl_2/BCl_3$ . . . . If it is a nitride layer 42 made from SiN, a suitable chemistry will be chosen, for example fluorinated chemistry.

As an example, the TiN layer 42, whose thickness is comprised between 10 nm and 30 nm, is etched by a $Cl_2/Ar/C_xH_y$ plasma generated by a RF field under a pressure of 15 mTorr, with a power of 500 W and a polarisation voltage of 200 V. The etching speed of the TiN by this plasma is about 1280 Å/min.

After step F8 of the method (FIGS. 3H, 4H), the holes 24' in the polystyrene layer 46' and the TiN layer 42 are not yet merged, and the critical dimension $CD_{via}$ of the contact areas is not reached. The widening of the holes thus has to be continued.

To do so, the TiN layer 42 is etched in an isotropic and selective manner with respect to the oxide 41 and the polystyrene 46'. This has the effect of widening the holes 24' which have just been transferred into the nitride layer 42. This step of isotropic etching of the TiN, also called "over-etching", is preferably carried out using a plasma of $Cl_2$ only, or $BCl_3/Cl_2$, without bombardment (for example under a pressure of 8 mTorr, for a power of 400 W and a zero polarisation voltage, the etching speed of the TiN then being around 800 Å/min).

These new, wider patterns are in turn transferred into the silicon oxide layer 41 by anisotropic etching through the layers 42 and 46', then again widened by isotropic etching of the oxide layer 41 (selectively with respect to the OPL layer 39). These anisotropic and isotropic etchings of the oxide are, preferably, carried out using fluorinated chemistry (e.g.: $CF_4$, $C_xF_y$, $CH_xF_y$, $SF_6$, $NF_3$, $C_xF_y/O2$, $C_xF_y/CH_xF_y$, $C_xF_y/Ar/CH_xF_y$, $C_xF_y/He/CH_xF_y$ . . . ).

As an example, the oxide layer 41, whose thickness of which is comprised between 10 nm and 30 nm, is etched in an anisotropic manner by a $CF_4/O_2$ plasma (7 mTorr, 900 W, 200 V, etching speed of the oxide of around 1384 Å/min), then in an isotropic manner by a $CF_4$ plasma without bombardment (5 mTorr, 800 W, 0 V, etching speed of around 256 Å/min).

During the isotropic etching of the oxide 41 (and to a lesser extent during the isotropic etching of the TiN), polystyrene is consumed, because the over-etching of the oxide 41 is not totally selective vis-à-vis the polystyrene of the layer 46'.

Thus, in this preferential embodiment, the widening of the holes in the layer 46' takes place at the same time as the widening of the holes in the second masking level 40, and more particularly in its oxide layer 41, until (in the layer 46' and the second masking level 40) a continuous trench 25 is obtained having a width equal to the desired critical dimension $CD_{via}$ (cf. FIG. 2).

The nitride layer 42 and the oxide layer 41 thereby etched form a second hard mask, which will make it possible to etch a portion of the OPL layer 39, during a later step of the method represented in FIGS. 3J and 4J.

The fact of using the second mask 40 allows to control more easily the widening of the holes and their merging into a continuous trench. Thanks to the good selectivity between the TiN and the copolymer on the one hand, and the low thickness of TiN to be etched on the other hand, it is possible to transfer easily the patterns of the copolymer into the TiN, even if there is a low thickness of copolymer. Once the holes have been transferred into the TiN layer 42, this one is sufficient to etch the underlying oxide 41. There are then no longer any constraints on the thickness of copolymer. The TiN/oxide mask is then sufficient to etch the OPL layer 39.

Depending on the thickness of the copolymer layer 46', the thickness of the mask 40 and the selectivity of the etching chemistries, it is possible to envisage using a mask 40 having a single layer 41, preferably made of TEOS oxide.

Figure 3I:
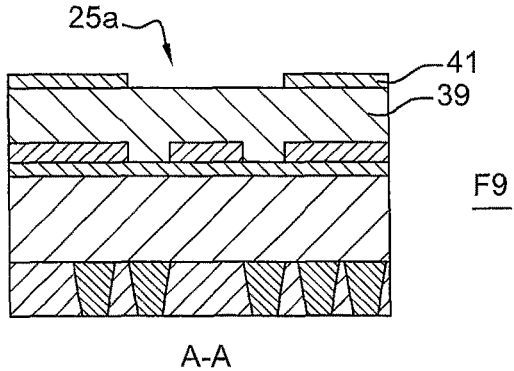
Figure 4I:
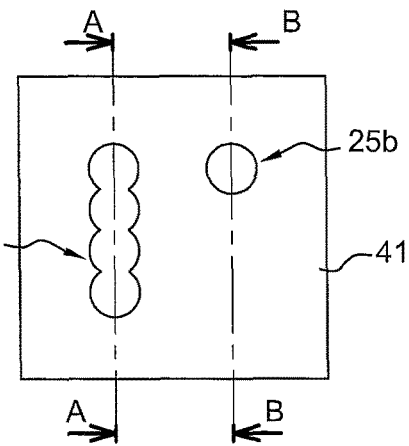
Figure 4J:
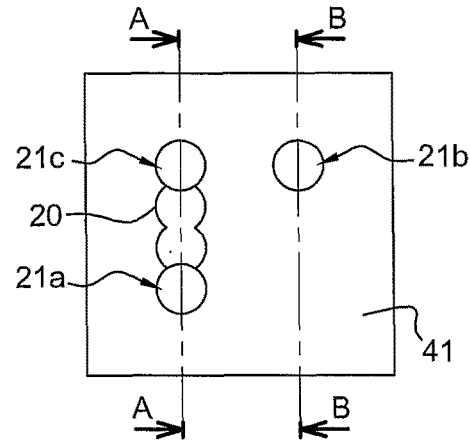

At step F9 of FIGS. 3I and 4I, the OPL layer 43 and the remaining layer of polystyrene 46' are removed from the substrate, selectively with respect to the oxide 41 and to the nitride 42. As is represented, the titanium nitride layer 42 is also removed. This latter removal is carried out selectively with respect to the oxide mask 41 and the OPL layer 39 situated under the oxide mask 41, for example by plasma etching with a gaseous mixture containing chlorine ($Cl_2$).

It is also possible, according to another sequence of steps, to remove the OPL layer 43 and the copolymer layer 46' before etching the oxide 41 (but after the transfer of the patterns into the nitride layer 42). The TiN layer 42 is then the only mask used to etch the oxide 41.

Figure 3J:
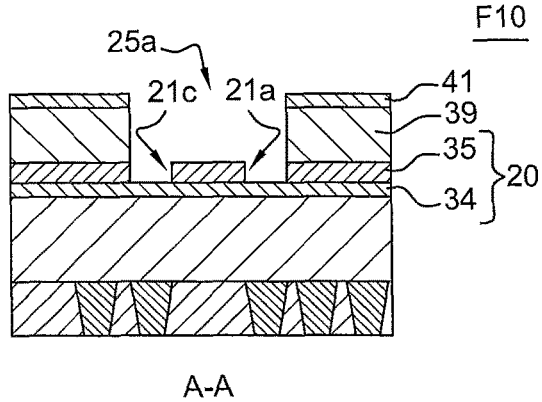

Step F10 represented in FIGS. 3J (sectional view along A-A) and 4J (top view) corresponds to the etching of the planarization layer 39 through the hard mask 41 made of silicon oxide. This etching is, for example, a plasma type dry etching. The etching emerges on the first mask 20, revealing a part of the recesses 21a and 21c. Since the etching is selective with respect to the titanium nitride and to the silicon oxide, none of the layers 34 and 35 is impacted by the etching of the organic material.

Potentially, step F10 may comprise, following the example of the TiN layer 42 and the oxide layer 41 of the upper mask, two etching steps, the first anisotropic and the second isotropic. Since the material of the OPL layer 39 is carbon-containing, these etchings are advantageously accomplished by using a chemistry based on $O_2$, as for the etching of the polystyrene. This optional isotropic etching allows if necessary to further widen the trench 25a in the OPL layer 39, in order that it totally encompasses the contact areas. This additional etching is not necessary if the desired widening is reached during the etching of the TiN and the oxide.

As an example, the planarization layer 39, the thickness of which is comprised between 50 nm and 300 nm, is etched in an anisotropic and isotropic manner by a $HBr/O_2$ plasma (5 mTorr, 533 W, 450 V, rate of etching of the OPL around 3000 Å/min).

Finally, in F11 (FIGS. 3K, 4K), the exposed parts of the oxide layer 34, that is to say the parts of the recesses 21a and 21c released by the etching of the organic material 39, are etched selectively with respect to the nitride layer 35. The openings in the oxide layer 34 are thereby limited to the areas that result from the superposition of the recesses 21a and 21c on the one hand, and of the trench 25a on the other hand.

This etching also allows to eliminate the oxide layer 41 situated on the OPL layer 39. It involves, preferably, an anisotropic etching using fluorinated chemistry ($C_xF_y$, $CH_xF_y$, $SF_6$, $NF_3$ for example).

Then, after opening of the oxide layer 34, contact holes 47 are obtained by etching the dielectric layer 32 through the mask 20 (that is to say in a selective manner with respect to the nitride and to the oxide) up to the lower interconnection layer 31. The OPL layer 39 is advantageously eliminated in the course of this second etching of step F11.

Figure 3K:
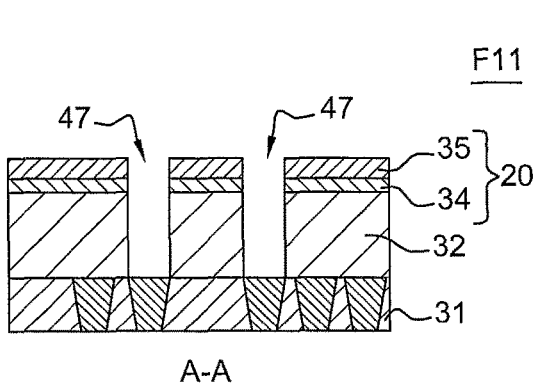
Figure 4K:
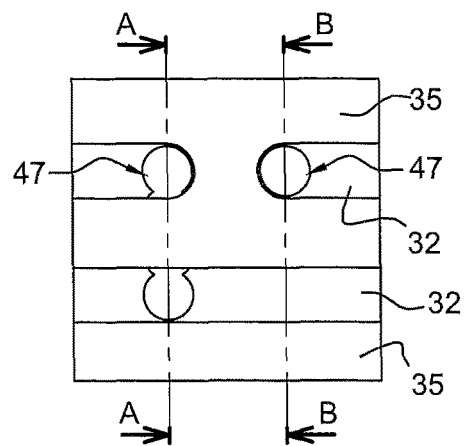
Figure 5H:
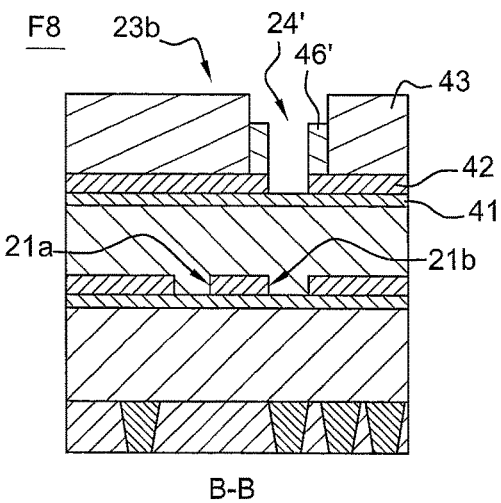
FIGS. 5H to 5L represent, in sectional view along the axis B-B of FIG. 2, the steps of the method for making patterns corresponding to FIGS. 3H to 3K.
Figure 5I:
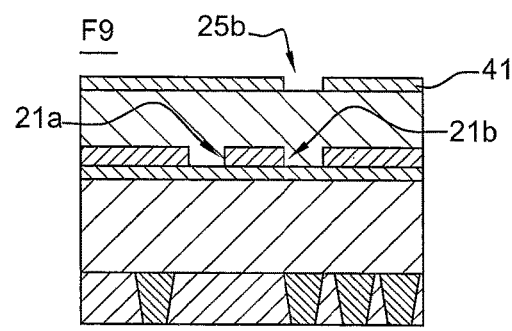
Figure 5J:
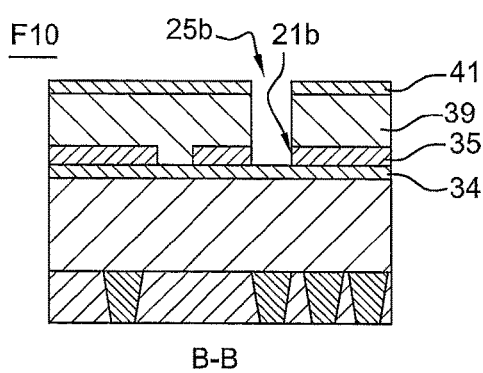
Figure 5K:
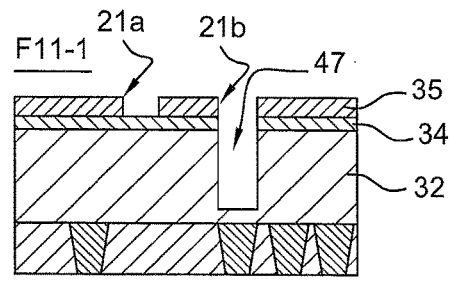
Figure 5L:
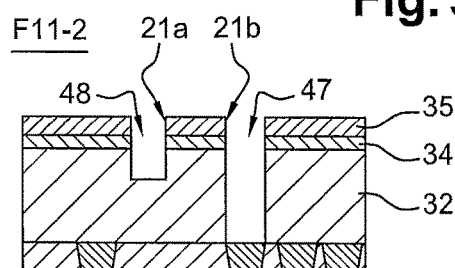

In the plane of section A-A of FIG. 3K, the contact holes 47 in the dielectric layer 32 are through holes. They emerge on metal tracks of the lower interconnection layer 31. Vias may then be formed, by filling with metal (for example copper) the contact holes, then by eliminating the surplus of metal that overflows the holes (for example, by chemical mechanical planarization, CMP). Advantageously, a barrier layer limiting the diffusion of metal into the dielectric material of the layer 32 is deposited in the contact holes 47, before their filling with the metal.

The method for making patterns described above may also lead to the formation of trenches which will receive the metal tracks of the upper interconnection level. The imprints of the metal lines have been indeed defined in the mask 20, at the step of FIGS. 3C and 4C. They are the areas to be metallised 21a to 21c.

FIGS. 5H to 5L reproduce some of the steps of the method (respectively F8, F9, F10 and F11, the latter being represented in two sub-steps F11-1 and F11-2), to show in what way it is possible to differentiate the formation of a contact hole (via) from the formation of a shallower trench (metal track). Whereas FIGS. 3A to 3K represented in section along the axis A-A of the steps for forming two adjacent contact holes (vias), FIGS. 5H to 5L are sectional views of the substrate along the axis B-B of FIG. 2, respectively during the steps F8, F9, F10 and F11. They show the formation of an isolated contact hole (contact area 22b) and a portion of trench corresponding to the area to be metallised 21a (FIG. 2).

Referring to the sectional views along the axis B-B, the steps of formation of the guide 23b, of assembly and of development of the block copolymer in the guide 23b (FIG. 5H) are limited to an area of the substrate which overhangs a portion only of the area to be metallised 21b (i.e. the contact area 22b of FIG. 2). Unlike the preceding case, the assembly guide 23b does not extend above the area to be metallised 21a, because no via is provided in this emplacement (cf. FIG. 2).

At steps F8 and F9 (FIGS. 5H-5I), the single hole 24' in the polystyrene layer 46', resulting from the elimination of the PMMA phase, is transferred within the second two-layer mask 41-42 then widened, as described previously in relation with FIGS. 3H and 3I. Opposite the area to be metallised 21a, the oxide layer 41 is left intact.

The widened hole 25b is propagated in F10 (FIG. 5J) in the planarization layer 39 through the oxide layer 41 of the second mask, then in F11-1 (FIG. 5K) in the dielectric layer 32 through the nitride layer 35 of the first mask, after opening of the oxide layer 34.

The opening of the oxide layer 34 in the widened hole 25b having enabled simultaneously the elimination of the upper oxide mask 41, the OPL layer 39 is exposed and etched at the same time as the dielectric layer 32 at step F11-1.

At the moment where the nitride mask 35 is released, the contact hole 47 is only partially formed. The etching of the layer 32 then continues, both in the area to be metallised 21b to finalise the through hole 47, but also in the area to be metallised 21a to form a shallower trench 48. This second phase F11-2 of the etching of the dielectric layer 32 is represented (in section along B-B) in FIG. 5L. The etching is stopped when the hole 47 reaches the metal track of the lower interconnection level. The etching of the trench 48 having started late with respect to that of the contact hole 47, the trench does not entirely traverse the layer 32. It is also possible to play on the etching selectivity between the 5 different materials to form this shallower trench.

Naturally, the method for making patterns according to the invention is not limited to the embodiment that has been described with reference to FIGS. 3 to 5 and numerous variants may be envisaged.

For example, materials other than those cited previously may be used, particularly for the block copolymer layer (PS-b-PDMS, PS-b-PMMA-b-PEO, PS-b-P2VP for example), the planarization layers (based on carbon-containing material in particular) and the different levels of mask (BN, $Si_xN_y$ for example). The number of these levels is also likely to vary, depending on the nature of the layers and the etching techniques used.

The assembly guides could be defined by chemi-epitaxy, rather than by grapho-epitaxy, by grafting onto the surface of the substrate a layer having different chemical properties depending on the regions.

Finally, in an alternative embodiment, the assembly guides may be formed by grapho-epitaxy directly in a layer of resin deposited on the second masking level, rather than in an organic planarization layer. This resin is then structured using an NTD (Negative Tone Development) method. It is not soluble in the solvent used to deposit the block copolymer.

The invention claimed is:

1. A method for making patterns on a surface of a substrate by self-assembly of block copolymer, comprising:
   forming on the surface of the substrate a first mask delimiting at least two areas to be metallised;
   forming an assembly guide above the first mask, such that the assembly guide delimits a surface covering two contact areas belonging respectively to the two areas to be metallised;
   depositing on said surface a block copolymer layer;
   reorganising the block copolymer layer;
   eliminating one of phases of the reorganised block copolymer layer, resulting in a plurality of holes extending into the block copolymer layer above the two contact areas and a portion of the first mask arranged between the two contact areas;
   widening by etching the holes of the block copolymer layer, until a continuous trench is formed above the two contact areas and said portion of the first mask;
   transferring, through the first mask, the continuous trench onto the surface of the substrate so as to form patterns corresponding to the contact areas.

2. The method according to claim 1, further comprising:
   depositing a planarization layer on the first mask and at least one layer intended to form a second mask on the planarization layer, the assembly guide and the block copolymer layer being formed on said layer intended to form the second mask;
   forming simultaneously the continuous trench in the block copolymer layer and in the second mask; and
   transferring the continuous trench of the second mask into the planarization layer up to the first mask.

3. The method according to claim 2, wherein the second mask is formed of a stack comprising a nitride layer and an oxide layer.

4. The method according to claim 3, wherein the formation of the trench in the second mask successively comprises a step of anisotropic etching of the nitride layer through the block copolymer layer, a step of isotropic etching of the nitride layer, a step of anisotropic etching of the oxide layer through the nitride layer and a step of isotropic etching of the oxide layer.

5. The method according to claim 4, wherein widening of the holes of the block copolymer layer takes place during steps of isotropic etching of the nitride layer and of the oxide layer.

6. The method according to claim 1, wherein the assembly guide is rectilinear and arranged such that the two contact areas occupy the ends of the surface delimited by the assembly guide.

7. The method according to claim 1, wherein the assembly guide is formed by grapho-epitaxy, the method further comprising a step of depositing a grafting layer on the lateral walls and at the bottom of the assembly guide.

8. The method according to claim 7, wherein the block copolymer contains polystyrene and polymethyl methacrylate and wherein the grafting layer is based on homopolystyrene.

9. The method according to claim 8, comprising, immediately after the elimination of one of the phases of the reorganised block copolymer layer, a step of etching the grafting layer by a plasma containing oxygen.

10. The method according to claim 1, wherein the substrate comprises an electrical connection level and a dielectric material layer covering the electrical connection level and in which are formed said patterns.

11. The method according to claim 10, wherein the patterns on the surface of the substrate are interconnection holes traversing the dielectric material layer up to the electrical connection level.

* * * * *